United States Patent [19]
Pianka

[11] Patent Number: 5,818,262
[45] Date of Patent: Oct. 6, 1998

[54] HIGH SPEED CMOS OUTPUT BUFFER USING 3 VOLT OR LOWER SUPPLY VOLTAGE SUPPLIED ON A PLURALITY OF BOND PADS

[75] Inventor: Juergen Pianka, Bethlehem, Pa.

[73] Assignee: Lucent Technologies Inc., Murray Hill, N.J.

[21] Appl. No.: 758,312

[22] Filed: Dec. 3, 1996

Related U.S. Application Data

[63] Continuation of Ser. No. 410,426, Mar. 23, 1995, abandoned.

[51] Int. Cl.⁶ ...................... H03K 19/0175; H03K 17/16
[52] U.S. Cl. .............................................. 326/87; 326/27
[58] Field of Search ............................... 326/121, 27, 83, 326/87

[56] References Cited

U.S. PATENT DOCUMENTS

| | | | |
|---|---|---|---|
| 5,065,224 | 11/1991 | Fraser et al. | 257/692 |
| 5,192,879 | 3/1993 | Aoki | 326/121 |
| 5,204,554 | 4/1993 | Ohannes | 326/33 |
| 5,206,544 | 4/1993 | Chen | 326/33 |
| 5,256,916 | 10/1993 | Thurston | 326/71 |
| 5,319,260 | 6/1994 | Wanless | 326/26 |
| 5,332,932 | 7/1994 | Runaldue | 326/33 |
| 5,604,453 | 2/1997 | Pedersen | 326/86 |

OTHER PUBLICATIONS

Carver Mead, Introduction to VLSI Systems, 1980, pp. 33–37.

Primary Examiner—Edward P. Westin
Assistant Examiner—Richard Roseen
Attorney, Agent, or Firm—James H. Fox

[57] ABSTRACT

A integrated circuit buffer includes a first inverter comprising a pull-up transistor of a first conductivity type (e.g., p-channel) and a pull-down transistor of a second conductivity type (e.g., n-channel) for driving a load. The buffer further includes a second inverter comprising a pull-up transistor of the second conductivity type (e.g., n-channel) and a pull-down transistor of the first conductivity type (e.g., p-channel) that also drives the load. The first and second inverters are driven by a drive circuit that provides signals that are substantially out of phase. Therefore, in operation the pull-up transistors are active during a first time period, and the pull-down transistors are active during a second time period. In this manner, the drive capability of the buffer is improved in the face of voltage bounce on the power supply bondpads, which is typically due to package inductance. In a preferred embodiment, the power supply voltages to the first and second inverters are provided through bondpads that are separate from those that provide the power supply voltages to the drive circuitry, thereby providing relatively low noise power to the drive circuitry.

8 Claims, 2 Drawing Sheets

HIGH SPEED CMOS OUTPUT BUFFER USING 3 VOLT OR LOWER SUPPLY VOLTAGE SUPPLIED ON A PLURALITY OF BOND PADS

This application is a continuation of application under 37 CFR 1.62 of prior application Ser. No. 08/410426 filed on Mar. 23, 1995 by Juegen Pianka for *High Speed Output Buffers in 3 Volts or Lower Voltage CMOS Technologies*, now abandoned.

BACKGROUND OF THE INVENTION

1. Field of the Invention

The present invention relates to an integrated circuit buffer.

2. Description of the Prior Art

Integrated circuits (ICs) use output buffers to drive external signal lines on printed circuit boards, multi-chip module (MCM) packages, and various other types of IC chip mounting substrates. The external signal lines typically present a significant capacitive load, and the drive capability of an output buffer is usually designed so as to drive an assumed load at a suitably high speed. On the other hand, high buffer switching speeds often significantly contribute to noise on the power supply, often referred to a "ground bounce".

Referring to FIG. 1, a typical output buffer 100 implemented in CMOS technology is illustrated. A bondpad 115 on the integrated circuit chip provides a connection to the positive power supply ($V_{DD}$) via terminal 114, whereas bondpad 116 provides a connection to the negative power supply ($V_{ss}$) via terminal 117. Note that an inductance 109 and 110 is shown in each power supply lead, representing the inherent inductance of the wire conductors in the case wherein the chip is mounted in a package. In the case of multi-chip modules, the major portion of inductance is typically due to the conductors on the MCM substrate. Although only a single bondpad is shown for each power supply, multiple bondpads are often used in order to reduce resistance and inductance from the power supply to the buffer and various other portions of the integrated circuit. For the highest possible switching speed with a high capacitive load 113 and a given inductance, the output transistors 102 and 103 can be sized to an optimum. However, increasing the size of 102 and 103 beyond the optimum does not proportionally increase the switching speed. This is because the inductances 109 and 110 produce a momentary voltage drop due to high current flow as transistors 102 and 103 switch. The current flow is due in part to charging or discharging capacitor 113, and also to the overlap current as both the pull-up transistor 102 and pull-down transistor 103 momentarily conduct simultaneously.

Referring to FIG. 2, an illustration of the momentary voltage drops due to current flow through the inductances is shown. The voltage at positive power supply bondpad 115 is shown by line 21, whereas the voltage at negative power supply bondpad 116 is shown by line 22. The magnitude of these voltages may differ, but are illustratively shown as equal, as in the case wherein a first group of output buffers connected to the same power supply bondpads switch high at the same time that a second group of output buffers connected to the bondpads switch low. The voltage $\Delta V$ represents the voltage difference between these power supply bondpads as the buffers switch at time $t_1$. The momentary voltage drops cause particular problems when the power supply voltage is relatively low as compared to magnitude of the voltage drops. For example, with a 3 volt power supply ($V_{DD}$=3 volts), a voltage drop across inductance 109 of 1.5 volts causes node 107 to drop to 3−1.5=1.5 volts during a low-to-high transition on the output node 106. Hence, there will be only a 1.5 volt gate-to-source voltage ($V_{gs}$) across transistor 102 when node 105 is low (0 volts). This value of $V_{gs}$ is only slightly in excess of a typical transistor threshold of about 1 volts. Hence, the output drive capability of the buffer is significantly limited. Furthermore, if enough buffers switch simultaneously in opposite directions, then the voltage across transistors 102 and 103 ($\Delta V$) may momentary drop to zero, entirely eliminating the ability of the buffer to drive the load.

SUMMARY OF THE INVENTION

I have invented an integrated circuit buffer that includes a first output inverter comprising a pull-up transistor of a first conductivity type and a pull-down transistor of a second conductivity type driving a buffer output node. The buffer further includes a source follower buffer circuit comprising a pull-up transistor of the second conductivity type and a pull-down transistor of the first conductivity type that also drives the node. The first and source follower buffer circuits are driven by a drive circuit that provides signals that are substantially out of phase. Therefore, in operation the pull-up transistors are active during a first time period, and the pull-down transistors are active during a second time period. In a preferred embodiment, the power supply voltages to the first and source follower buffer circuits are provided through bondpads that are separate from those that provide the power supply voltages to the drive circuitry.

DETAILED DESCRIPTION

Figure 1:
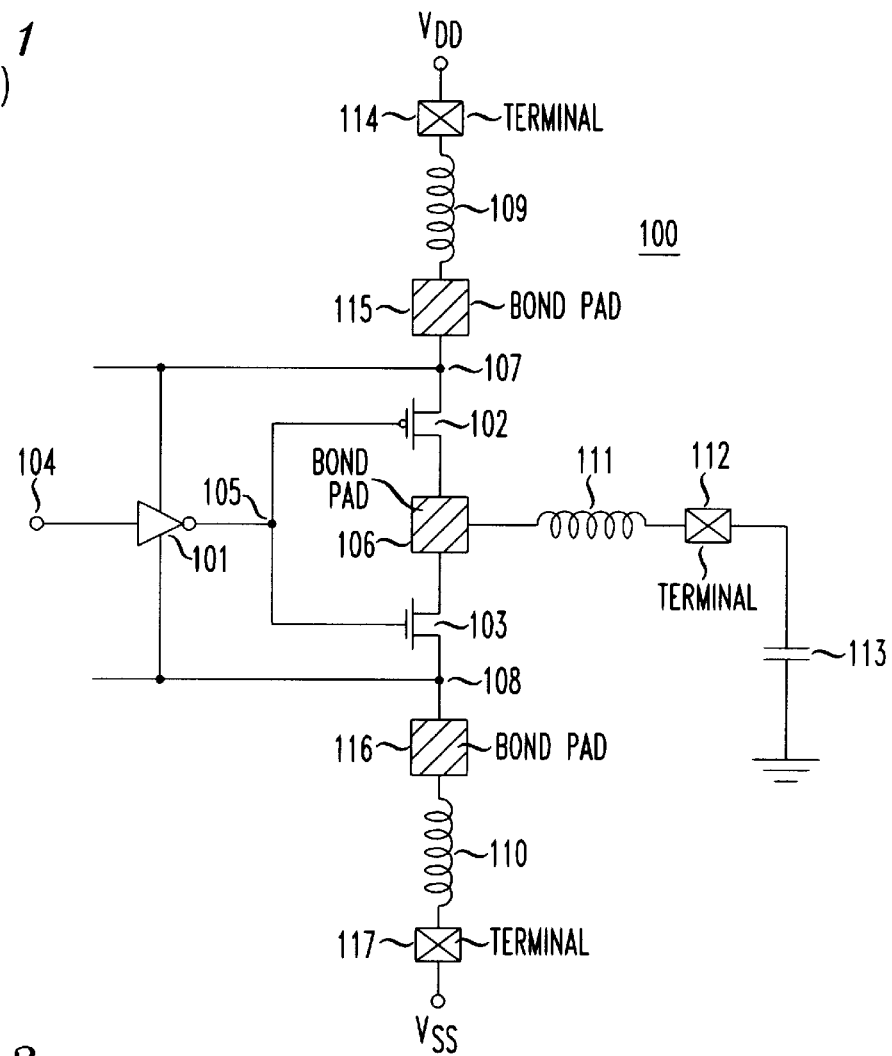
FIG. 1 shows a typical prior-art output buffer.
Figure 2:
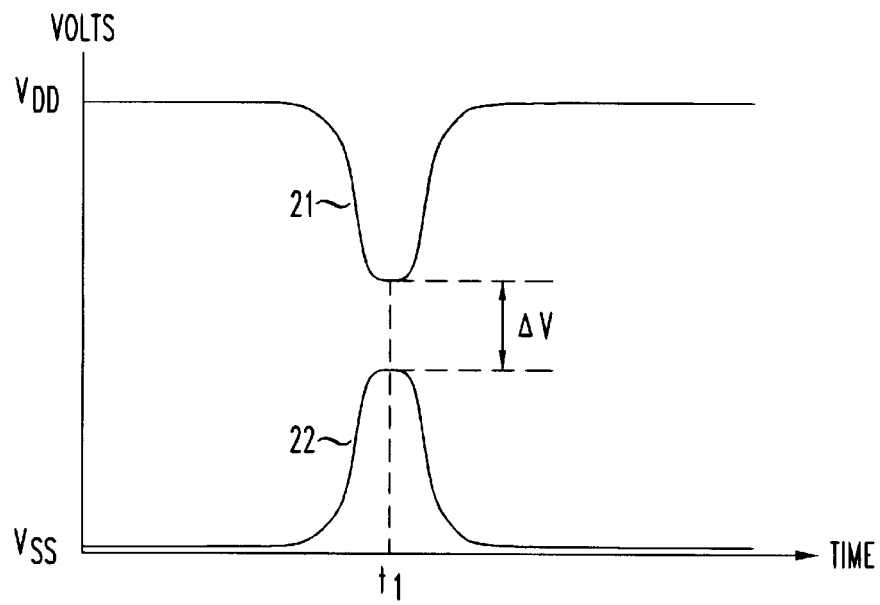
FIG. 2 shows momentary voltage drops associated with the operation of the output buffer of FIG. 1.
Figure 3:
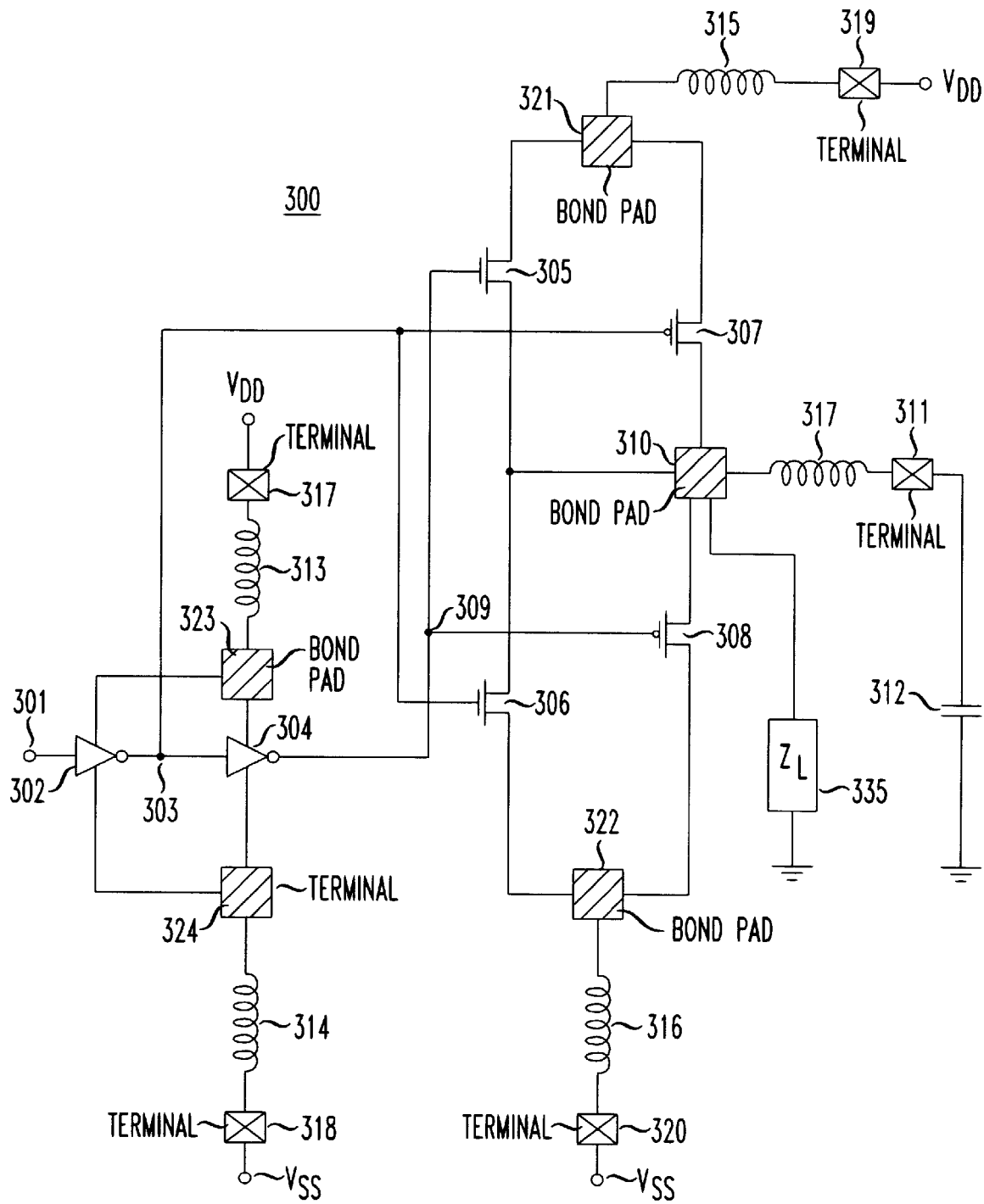
FIG. 3 shows an illustrative embodiment of the inventive buffer.

The following detailed description relates to an integrated circuit buffer. The inventive buffer may be used for driving a load that is external to the integrated circuit on which it is formed, in which case it is referred to as an output buffer. In another application, the inventive buffer may be used to drive a load on the same integrated circuit as the one on which it is formed; as for example, in the case of a clock driver. Referring to FIG. 3, an illustrative embodiment of the inventive buffer implemented in CMOS technology is shown. The buffer input signal is supplied at node 301 to the first driver inverter 302, the output of which is supplied to node 303. The node 303 also connects to the gates of p-channel pull-up transistor 307 and n-channel pull-down transistor 306. The transistors 307 and 306 form a first output inverter that drives the buffer output node 310, being a bondpad in the illustrative case. The signal on bondpad 310 is coupled to package terminal 311 through a conductor having an inherent self-inductance 317, and the output load represented by capacitor 312 is driven thereby. The first output inverter may be considered to operate in a manner analogous to the output inverter shown in FIG. 1.

A second driver inverter 304 has its input connected to the output of inverter 302. Therefore, the drive signal at the output of inverter 304 (e.g., at node 309) is out of phase with the drive signal at the output of inverter 302 (e.g. at node 303). The node 309 connects to the gates of n-channel pull-up transistor 305 and p-channel pull-down transistor 308. The transistors 305 and 308 form a source follower buffer circuit that also drives the buffer output node 310. Since the drive signals to the first and source follower buffer circuits are out of phase, both the pull-up transistors (305, 307) will conduct simultaneously when the buffer input signal on node 301 is high. This is because node 303 is then low, causing 307 to conduct, and node 309 is high, causing 305 to conduct. Similarly, both the pull-down transistors (306, 308) will conduct simultaneously when the buffer input signal on node 301 is low, since node 303 is high and node 309 is low.

Therefore, in operation, if a voltage drop across inductance 315 reduces the voltage at power supply bondpad 321 at the same time that driver node 303 is low, the gate-to-source voltage across p-channel pull-up transistor 307 is reduced. Hence, the pull-up drive capability of transistor 307 is reduced, as in the prior-art output buffers. However, at the same time, the n-channel pull-up transistor 305 becomes active due to a high voltage on driver node 309. The gate-to-source voltage ($V_{gs}$) for transistor 305 is the voltage at node 309 minus the voltage at output node 310. Since the voltage on the output node 310 is initially low in this case, this value of $V_{gs}$ is typically sufficient in magnitude to turn transistor 305 fully on, so that it helps to pull up output node 310 and thereby drive the load. Hence, the additional pull-up transistor 305 helps to overcome the effects of the voltage drop across inductance 315.

Similarly, if a voltage drop across inductance 316 increases the voltage at power supply bondpad 322 at the same time that drive node 303 is high, the gate-to-source voltage across n-channel pull-down transistor 306 is reduced. Hence, the pull-down drive capability of transistor 306 is reduced, as in the prior-art output buffers. However, at the same time, the p-channel pull-down transistor 308 becomes active due to a low voltage on driver node 309. The gate-to-source voltage for transistor 308 is the voltage at node 309 minus the voltage at output node 310. Since the voltage on output node 310 is initially high in this case, this value of $V_{gs}$ (a negative value) is typically sufficient in magnitude to turn transistor 308 fully on, so that it helps to pull down output node 310 and thereby drive the load. Hence, the additional pull-down transistor 308 helps to overcome the effects of the voltage drop across inductance 316.

In the preferred embodiment shown in FIG. 3, note also that the power supply to the output inverters is supplied through bondpads (321, 322) that are separate from the bondpads (323, 324) that supply the driver inverters 302 and 304. This helps isolates the driver inverters from the noise on the power supply, since the current flow through (and hence voltage drop across) inductances 313, 314 is less than the current flow through inductances 315, 316. Furthermore, it is also possible to supply the first and second output inverters through separate bondpads (not shown). The use of separate power supply busses and separate bondpads for different portions of an integrated circuit is otherwise known in the art. However, it is especially advantageous for the drive circuitry of the present invention, as it helps preserve the full drive capability to both sets of output inverters. However, this split power supply is optional insofar as the present invention is concerned.

While the drive signals (on nodes 303 and 309) are typically out-of-phase by approximately 180 degrees, other out-of-phase values are possible. For example, it may be desirable in some cases to turn on one of the output inverters before the other, as for waveform shaping to reduce ground bounce noise. In that case, the drive signal to that inverter would precede the drive signal to the other inverter by a given degree. Therefore, the drive signals would have an overlapping in-phase portion, while still maintaining a substantial degree of overlap in the out-of-phase portion of the drive signals. In typical cases, I recommend that the drive signals range from 150 degrees to 210 degrees out-of-phase, with a wider range being possible. The driver stages described above comprise two inverters (302, 304), with each inverter driving both the pull-up and pull-in transistors in the corresponding output inverter. However, other driver configurations are possible. For example, a given driver stage may include NAND or NOR gates for separately providing the drive signal to the pull-up and pull-down transistors in a given output inverter, as when implementing tri-state buffers, according to principles known in the art. Additionally, the output node 310 may be connected to a load 335 (represented by the complex impedance $Z_L$) located on the same integrated circuit as the output buffer.

The above preferred embodiment has been illustrated for CMOS technology, but the inventive technique may be used with bipolar technology as well. In that case, pnp bipolar transistors may be used in lieu of p-channel MOS transistors, and npn bipolar transistors may be used in lieu of n-channel MOS transistors, according to principles known in the art. In fact, a mixed type of design is possible, with one output inverter being of the bipolar type, and the other output inverter being of the MOS type. The integrated circuit having the inventive buffer may be located in a multi-chip module or other type of interconnect arrangement in lieu of a package having terminals that are wire bonded to the bondpads as discussed above in the preferred embodiment. Also, the buffer may be used to drive loads internal to the integrated circuit, as noted above.

The invention claimed is:

1. An integrated circuit implemented in a 3 Volt or less technology and comprising an output buffer that includes a source follower buffer circuit having a pull-up transistor of a first conductivity type and a pull-down transistor of a second conductivity type for pulling a buffer output node alternately toward first and second power supply voltages respectively, said pull-up and pull-down transistors being connected as source followers, characterized in that said output buffer also includes an output inverter having a pull-up transistor of said second conductivity type connected in a common source configuration and a pull-down transistor of said first conductivity type connected in a common source configuration for pulling said buffer output node alternately toward said first and second power supply voltages respectively;

and further characterized in that said output buffer also includes a driver circuit that supplies a first drive signal to said source follower buffer circuit, and a second drive signal to said output inverter, wherein the first and second drive signals are substantially out-of-phase; and wherein the source follower buffer circuit and output inverter are supplied with power supply voltages from bondpads on said integrated circuit that are separate from the bondpads that supply power supply voltages to the driver circuit.

2. The invention of claim 1 wherein the pull-up transistor in the first output inverter is a p-channel field effect transistor, and the pull-down transistor in the first output inverter is an n-channel field effect transistor.

3. The invention of claim 2 wherein the pull-up transistor in the second output inverter is an n-channel field effect transistor and the pull-down transistor in the second output inverter is a p-channel field effect transistor.

4. The invention of claim 1 wherein said integrated circuit is located in a package having terminals, and said buffer output node is connected to a package terminal.

5. The invention of claim 1 wherein said buffer output node is connected to a load located on said integrated circuit.

6. An integrated circuit implemented in a 3 volt or less technology and located in a package having terminals, said integrated circuit including an output buffer having an output node connected to a package terminal, and with said output buffer including an output inverter having a p-channel pull-up transistor and an n-channel pull-down transistor for pulling said buffer output node alternately toward first and second power supply voltages respectively, characterized in that said buffer also includes a source follower buffer circuit having an n-channel pull-up transistor and a p-channel pull-down transistor for pulling said buffer output node alternately toward said first and second power supply voltages respectively;

and further characterized in that said buffer also includes a driver circuit that supplies a first drive signal to said inverter, and a second drive signal to said source follower buffer circuit, wherein the first and second drive signals are substantially out-of-phase; and wherein the inverter and source follower buffer circuit are supplied with power supply voltages from bondpads on said integrated circuit that are separate from the bondpads that supply power supply voltages to the driver circuit.

7. The invention of claim 1 wherein said first and second power supply voltages provide an operating voltage of approximately 3 volts to said buffer.

8. The invention of claim 6 wherein said first and second power supply voltages provide an operating voltage of approximately 3 volts to said buffer.

* * * * *